United States Patent [19]

Matsui et al.

[11] Patent Number: 5,363,331
[45] Date of Patent: Nov. 8, 1994

[54] SEMICONDUCTOR MEMORY WITH COLUMN LINE CONTROL CIRCUITS FOR PROTECTION AGAINST BROKEN COLUMN LINES

[75] Inventors: Katsuaki Matsui; Sampei Miyamoto, both of Tokyo, Japan

[73] Assignee: Oki Electric Industry Co., Ltd., Tokyo, Japan

[21] Appl. No.: 994,674

[22] Filed: Dec. 22, 1992

[30] Foreign Application Priority Data

Dec. 24, 1991 [JP] Japan .................... 3-341234

[51] Int. Cl.$^5$ .................................... G11C 7/02
[52] U.S. Cl. .................... 365/189.06; 365/189.01; 365/189.11; 365/230.03
[58] Field of Search ............. 365/149, 189.01, 189.06, 365/189.11, 230.03

[56] References Cited

U.S. PATENT DOCUMENTS 4,825,418 4/1989 Itoh et al. .................. 365/230.03
5,161,121 11/1992 Cho .......................... 365/189.06

FOREIGN PATENT DOCUMENTS 60-136087  7/1985 Japan ............. G11C 11/34
60-263392 12/1985 Japan ............. G11C 11/34
0194695  8/1986 Japan ............. 365/189.06
61-258397 11/1986 Japan ............. G11C 29/00
62-275392 11/1987 Japan ............. G11C 17/00
4-32092  2/1992 Japan ............. G11C 11/41

*Primary Examiner*—Eugene R. LaRoche
*Assistant Examiner*—F. Niranjan
*Attorney, Agent, or Firm*—Edward D. Manzo

[57] ABSTRACT

A semiconductor memory device has plural memory cell blocks, each including memory cells storing data therein. A data bus and switching circuits transfer data from the memory cells to the data bus in response to a first logic level signal applied thereto. Column lines each have first and second ends. Each column line is connected to the corresponding switching circuit in each of the memory cell blocks. A column decoder, coupled to the first end of the column lines, provides the first logic level signal to one of the column lines upon the memory cell blocks being accessed. Potential setting circuits are coupled to the second end of the column lines, and preliminarily set the respective column lines to be in a predetermined potential so that each switching circuit is inactive prior to the column decoder providing the first logic level signal. All the memory cells in an array can be prevented from becoming inoperative even if a column line is broken.

17 Claims, 5 Drawing Sheets

FIG. IA
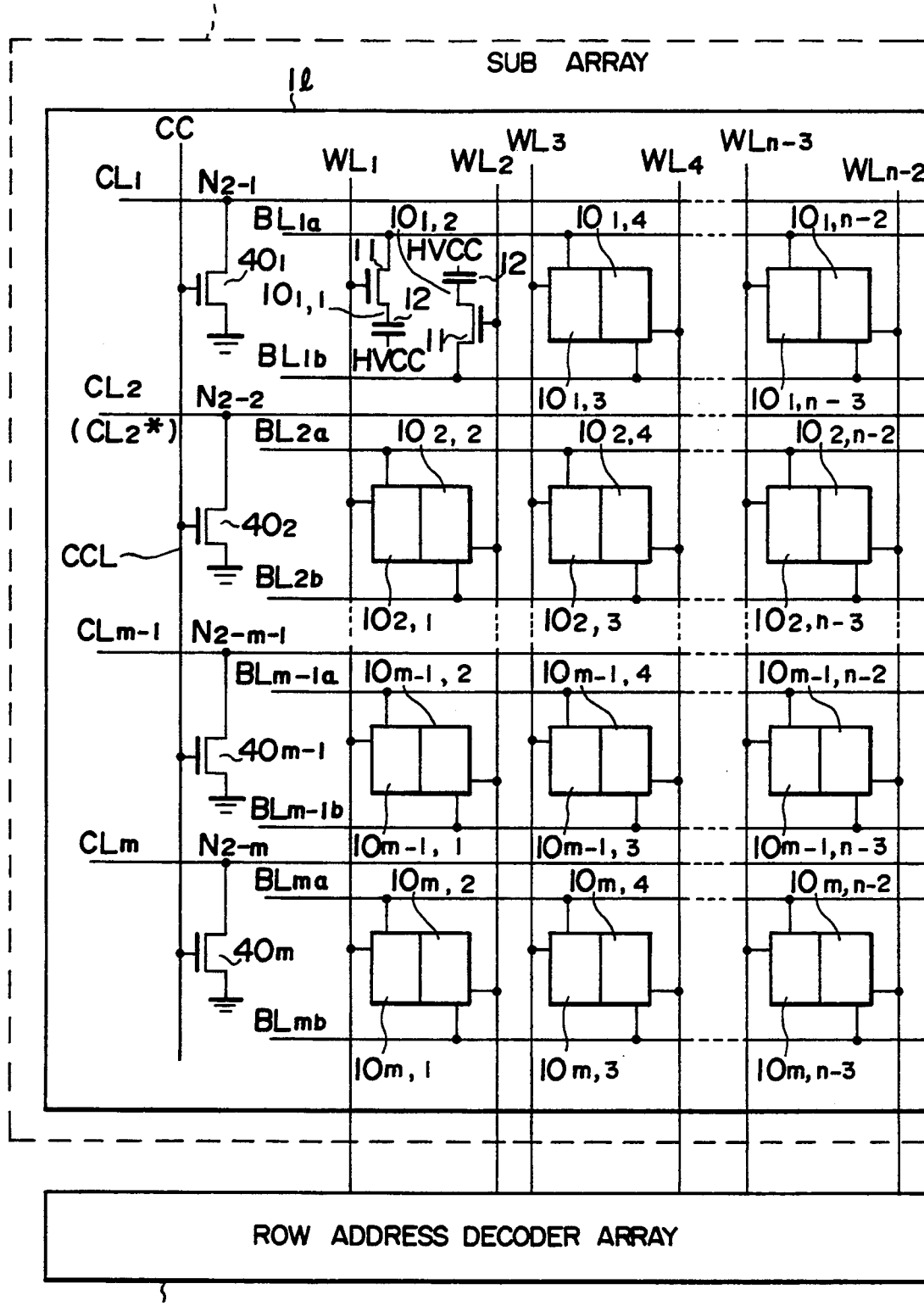

SEMICONDUCTOR MEMORY WITH COLUMN LINE CONTROL CIRCUITS FOR PROTECTION AGAINST BROKEN COLUMN LINES

REFERENCE TO RELATED APPLICATIONS

This application claims the right of priority under 35 U.S.C. 119, of Japanese Patent Application Serial No. 03-341234, filed on Dec. 24, 1991.

BACKGROUND OF THE INVENTION

1. Field of the Invention

The present invention relates to a semiconductor memory device capable of preventing a failure in memory cells, which is caused by the breaking of a column address selection signal line.

2. Description of the Related Art

A semiconductor memory device such as a Dynamic Random Access Memory (DRAM) has a memory cell array comprised of a plurality of sub arrays. Each of the sub arrays has a plurality of word lines, a plurality of bit line pairs disposed so as to intersect the corresponding word lines, and a plurality of column address selection signal lines (column lines) arranged in parallel to the bit line pairs respectively. Memory cells are respectively connected to points where the word lines intersect the bit line pairs, and arranged in matrix form. The memory cell array is electrically connected with a row address decoder array and a column address decoder array.

A DRAM, for example, is disclosed in the Japanese Laid-Open Patent Publication No. 60-136087, published on Jul. 19th, 1985.

SUMMARY OF THE INVENTION

It is an object of the present invention to provide a semiconductor memory device wherein when an arbitrary column line is broken, memory cells disposed in a memory cell array can be prevented from becoming inoperative.

In order to achieve the above object, a memory of a first invention of the present application comprises a plurality of memory cell blocks each including a plurality of memory cells each storing data therein, a data bus and a plurality of switching circuits respectively transferring data from the memory cells to the data bus in response to a first logic level signal applied thereto; a plurality of column lines each having first and second ends thereof, the column lines each being connected to the corresponding switching circuit in each of the memory cell blocks; a column decoder, coupled to the first end of the column lines, providing the first logic level signal to one of the column lines upon the memory cell blocks being accessed; and a plurality of potential setting circuits, coupled to the second end of the column lines, preliminarily settling the respective column lines to be in a predetermined potential so that each switching circuits is inactive prior to the column decoder providing the first logic level signal.

With the above arrangement, all the memory cells disposed in a memory cell array can be prevented from becoming inoperative even if an arbitrary column line is broken.

BRIEF DESCRIPTION OF THE DRAWINGS

While the specification concludes with claims particularly pointing out and distinctly claiming the subject matter which is regarded as the inventions it is believed that the invention, the objects, features and advantages thereof will be better understood from the following description taken in connection with the accompanying drawings in which:

DETAILED DESCRIPTION OF THE PREFERRED EMBODIMENTS

Figure 1B:
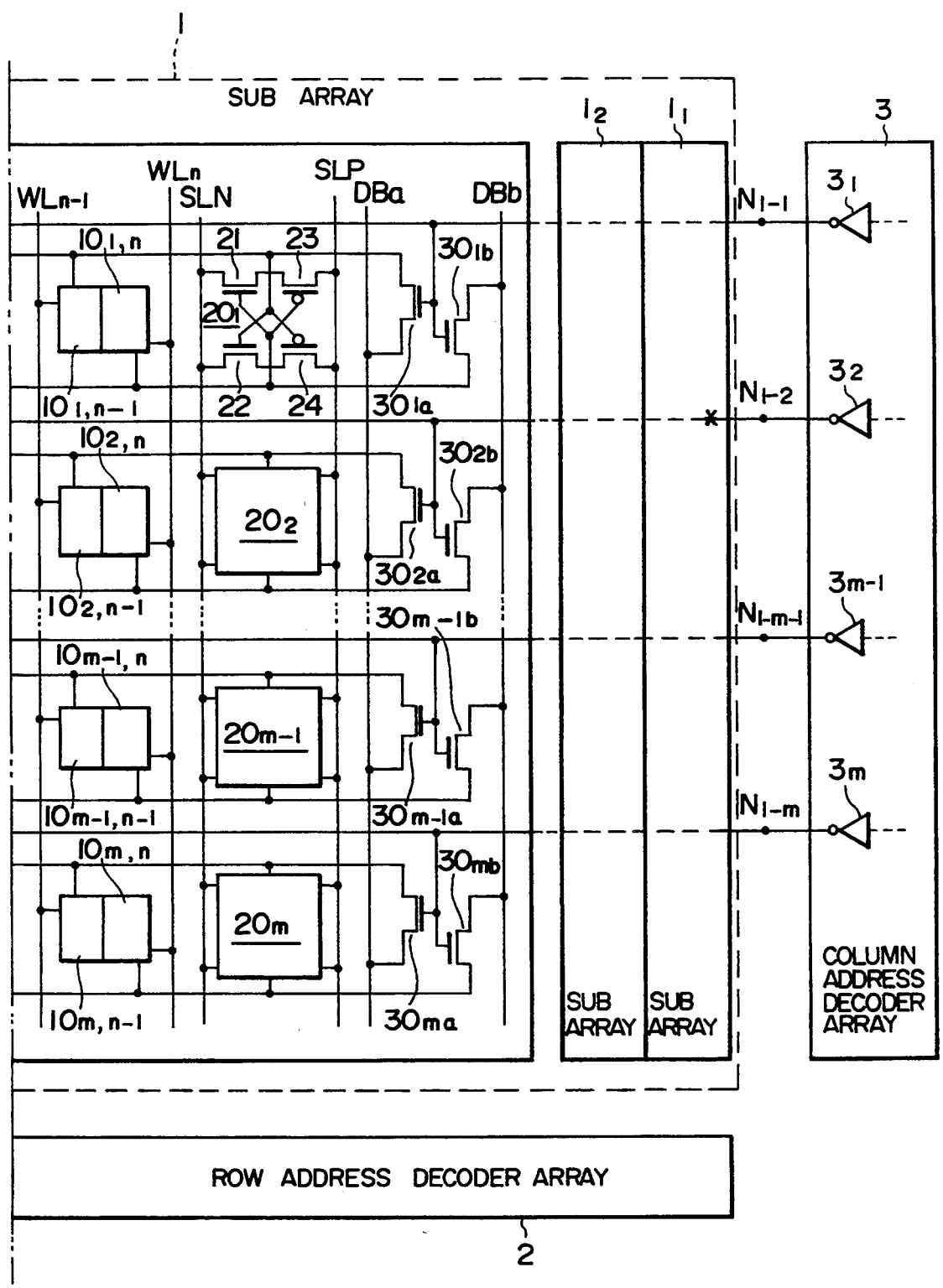
FIG. 1 is formed by FIG. 1A and FIG. 1B and shows a block diagram of the semiconductor memory device constructed in accordance with the preferred embodiment of the invention.

A semiconductor memory device, for example that is a DRAM, according to one embodiment of the present invention, is shown in FIG. 1.

The semiconductor memory device has a memory cell array 1 comprising a plurality of sub arrays $1_k$ ($k=1, 2, \ldots, 1$). A row address decoder array 2 and a column address decoder array 3 are electrically connected to the memory cell array 1. The row address decoder array 2 comprises a row address decoder for selecting one of word lines $WL_j$ in response to a row address signal and a redundant row address decoder for selecting a pair of redundant word lines so as to determine a row used as an alternative to a defective or faulty row. The column address decoder array 3 comprises a column address decoder for selecting one of column lines $CL_i$ ($i=1, 2, \ldots, m$) in response to a column address signal and a redundant column address decoder for selecting a redundant column line so as to determine a column used as an alternative to a defective or faulty column. The column lines $CL_i$ are electrically connected to their corresponding nodes $N_{1-i}$ ($i=1, 2, \ldots, m$). The nodes $N_{1-i}$ are electrically connected to elements disposed within the column address decoder, for example, their corresponding output terminals of inverters $3_i$ ($i=1, 2, \ldots, n$) in the present embodiment.

The respective sub arrays $1_k$ comprise a plurality of word lines $WL_j$ ($j=1, 2, \ldots, n$), a plurality of bit lines pairs $BL_i a$, $BL_i b$ ($i=1, 2, \ldots, m$) disposed so as to intersect the corresponding word lines $WL_j$, a plurality of column address selection signal lines (hereinafter called "column lines") $CL_i$ ($i=1, 2, \ldots, m$) disposed in parallel to the bit line pairs $BL_i a$, $BL_i b$, sense amplifier enable signal lines SLN, SLP arranged in parallel to the word lines $WL_j$, and complementary data buses $DB_a$, $DB_b$. For example, $WL_{n-1}$, $WL_n$ of the word lines $WL_j$ are used as a pair of redundant word lines. For example, $BL_m a$, $BL_m b$ of the bit line pairs $BL_i a$, $BL_i b$ are used as redundant bit lines. Further, for example, $CL_m$ of the column lines $CL_i$ is used as a redundant column line.

Memory cells $10_{ij}$ ($i=1, 2, \ldots, m, j=1, 2, \ldots, n$) are respectively connected to points where the word lines $WL_j$ and the bit lines $BL_i$ intersect, and arranged in matrix form. Each of the memory cells $10_{ij}$ has a charge transfer N-channel MOS transistor (Metal Oxide Semiconductor) (hereinafter called an "NMOS") 11 and a charge storage capacitor 12. The drain electrodes of the NMOSs 11 are electrically connected to the corresponding bit lines $BL_ia$ or $BL_ib$, and the gate electrodes thereof are electrically connected to the corresponding word lines $WL_j$. Further, each of the source electrodes of the NMOSs 11 is electrically connected via the capacitor 12 to its corresponding fixed potential or voltage HVCC whose voltage level is equal to half that of a power source potential or voltage VCC.

Sense amplifiers $20_i$ (i=1, 2, ..., m) for detecting differences in voltages between the respective bit line pairs and amplifying the so-detected differences are electrically connected between the respective bit line pairs $BL_ia$ and $BL_ib$ respectively. When the sense amplifier enable signal lines SLP and SLN are brought to "H" and "L" levels respectively, the respective sense amplifiers $20_i$ are activated to amplify the differences in voltages between the respective bit line pairs. Each of the sense amplifiers $20_i$ comprises a pair of NMOSs 21, 22 and a pair of P-channel MOS transistors (hereinafter called "PMOSs") 23, 24. The respective source electrodes of the NMOSs 21, 22 are electrically connected to the sense amplifier enable signal line SLN. The gate electrodes of the NMOSs 21 are electrically connected to the bit lines $BL_ib$ respectively, whereas the drain electrodes thereof are electrically connected to the bit lines $BL_ia$ respectively. On the other hand, the gate electrodes of the NMOSs 22 are electrically connected to the corresponding bit lines $BL_ia$ and the respective drain electrodes thereof are electrically connected to the corresponding bit lines $BL_ib$. The respective source electrodes of the PMOSs 23, 24 are electrically connected to the sense amplifier enable signal line SLP. The gate electrodes of the PMOSs 23 are electrically connected to the bit lines $BL_ib$ respectively, whereas the drain electrodes thereof are electrically connected to the bit lines $BL_ia$ respectively. On the other hand, the gate electrodes of the PMOSs 24 are electrically connected to the bit lines $BL_ia$ respectively and the drain electrodes thereof are electrically connected to the bit lines $BL_ib$ respectively.

Transfer gates $30_ia$, $30_ib$ (i=1, 2, ..., m) which are to be controlled by the column lines $CL_i$, are electrically connected between the bit line pairs $BL_ia$, $BL_ib$ and the data buses $DB_a$, $DB_b$. The respective transfer gates $30_ia$, $30_ib$ are comprised of NMOSs. The drain electrodes of the transfer gates $30_ia$ are electrically connected to the bit lines $BL_ia$ respectively, whereas the respective source electrodes thereof are electrically connected to the data bus $DB_a$. The drain electrodes of the transfer gates $30_ib$ are electrically connected to the bit lines $BL_ib$ respectively and the respective source electrodes thereof are electrically connected to the data bus $DB_b$. The gate electrodes of the transfer gates $30_ia$, $30_ib$ are electrically connected in common to the column lines $CL_i$ respectively.

Clamping transistors NMOSs $40_i$ (i=1, 2, ..., m) capable of clamping the column lines $CL_i$ to "L" levels respectively, are electrically connected to their corresponding nodes $N_{2-i}$ (i=1, 2, ..., m), spaced farthest away from the column address decoder array 3, of the column lines $CL_i$ (i=1, 2, ..., m) in the sub arrays $1_k$. In fact, the probability of breaking or disconnection of a single column line at several points is very low. It may be thus considered that the clamping transistors NMOSs $40_i$ are electrically connected to only the corresponding column lines $CL_i$ in the sub array $1_1$.

The drain electrodes of the clamping transistors NMOSs $40_i$ are electrically connected to the column lines $CL_i$ respectively and the source electrodes thereof are electrically connected to a ground electrode of a ground potential level. Further, the gate electrodes of the clamping transistors NMOSs $40_i$ are electrically connected in common to a column-line clamping signal line CCL. The column-line clamping signal line CCL is supplied with a column-line clamping signal CC. In the present embodiment, the clamping transistors are NMOS types but may be P-channel transistors (PMOS types).

Figure 2:
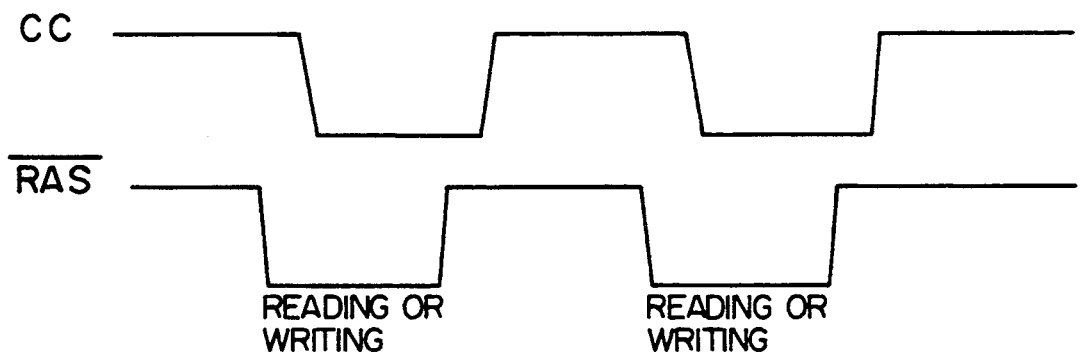
FIG. 2 is a first partial chart to explain the discharging operation of the clamping circuit shown in FIG. 1.

FIG. 2 illustrates the waveform of the column-line clamping signal CC. In response to a row address strobe signal $\overline{RAS}$ supplied to the row address decoder from the outside, the column-line clamping signal CC is brought to an "L" level upon reading and writing of data (when $\overline{RAS}$ is "L" in level). When, on the other hand, the column-line clamping signal CC is brought to an "H" level upon standing ready to read and write the data (when $\overline{RAS}$ is "H" in level).

Figure 3:
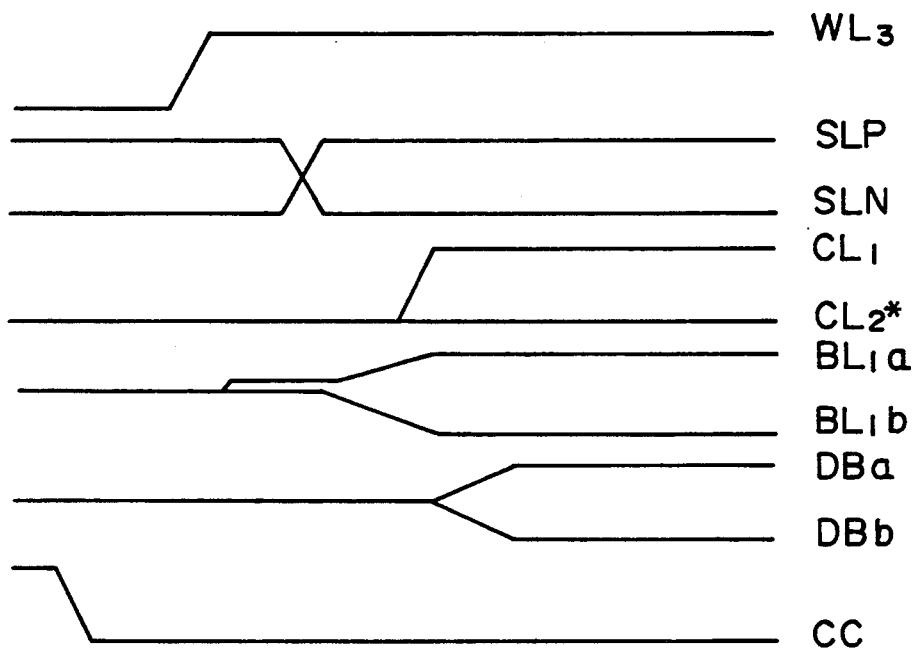
FIG. 3 is a second partial chart to explain the discharging operation of the clamping circuit shown in FIG. 1.

A description will be made below of a data reading operation effected by other sub array $1_1$ disposed between the column address decoder array 3 and the sub array $1_1$, for example, when a column line $CL_2$ is electrically disconnected, with reference to FIGS. 1 and 3. The operation of reading of data from a memory cell $10_{1,3}$ shown in FIG. 1, will be described below as an illustrative example. A column line $CL_2^*$ shown in FIG. 1 indicates the state of being electrically disconnected from others.

Data "1" is first written into the memory cell $10_{1,3}$ and data "0" is then written into a memory cell $10_{2,3}$.

Before the respective sub arrays $1_k$ start to read data, that is, when the strobe signal $\overline{RAS}$ is "H" in level, the column-line clamping signal CC is rendered "H" in level. Therefore, the clamping transistor NMOS $40_2$ is turned ON, thereby clamping the column line $CL_2$ to the "L" level.

When the respective sub arrays $1_k$ initiate data reading operations, i.e., when the strobe signal $\overline{RAS}$ is "L" in level, the column-line clamping signal CC is brought to the "L" level, with the result that the clamping transistor NMOSs $40_i$ are turned OFF. Thereafter, the word line $WL_3$, which has been selected by the row address decoder, is rendered "H" in level. The NMOSs 11 of the memory cells $10_{1,3}, \ldots, 10_{m,3}$ electrically connected to the word line $WL_3$, are turned ON, so that data which have been stored in the memory cells $10_{1,3}, \ldots 10_{m,3}$, are transmitted to the bit lines $BL_ia$ (i=1, 2, ..., m). Next, when the sense amplifier enable signal lines SLP and SLN are brought to the "H" and "L" levels respectively, the respective sense amplifiers $20_i$ (i=1, 2, ..., m) are activated. As a result, the differences in voltages between the respective bit line pairs $BL_ia$ and $BL_ib$ (i=1, 2, ..., m) are detected and amplified.

When the column line $CL_1$ which has been selected by the column address decoder is then rendered "H" in level, the transfer gates $30_1a$, $30_1b$ are turned ON. When the transfer gates $30_1a$, $30_1b$ are turned ON, the pair of bit lines $BL_1a$, $BL_1b$ and the data buses $DB_a$, $DB_b$ are allowed to conduct, thereby outputting data "1" read at the pair of bit lines $BL_1a$, $BL_1b$ to the data buses $DB_a$, $DB_b$ respectively.

Even if the column line $CL_2^*$ is brought to a floating state by disconnection with its potential or voltage level remaining at an "H" level, the column line $CL_2^*$ is reliably clamped to the "L" level by the clamping transistor NMOS $40_2$. Therefore, the data stored in the non-selected memory cell $10_{2,3}$ is not erroneously transferred to the data buses $DB_a$, $DB_b$. Only the data which has been stored in the memory cell $10_{1,3}$, is accurately read and supplied to the data buses $DB_a$, $DB_b$.

Figure 4:
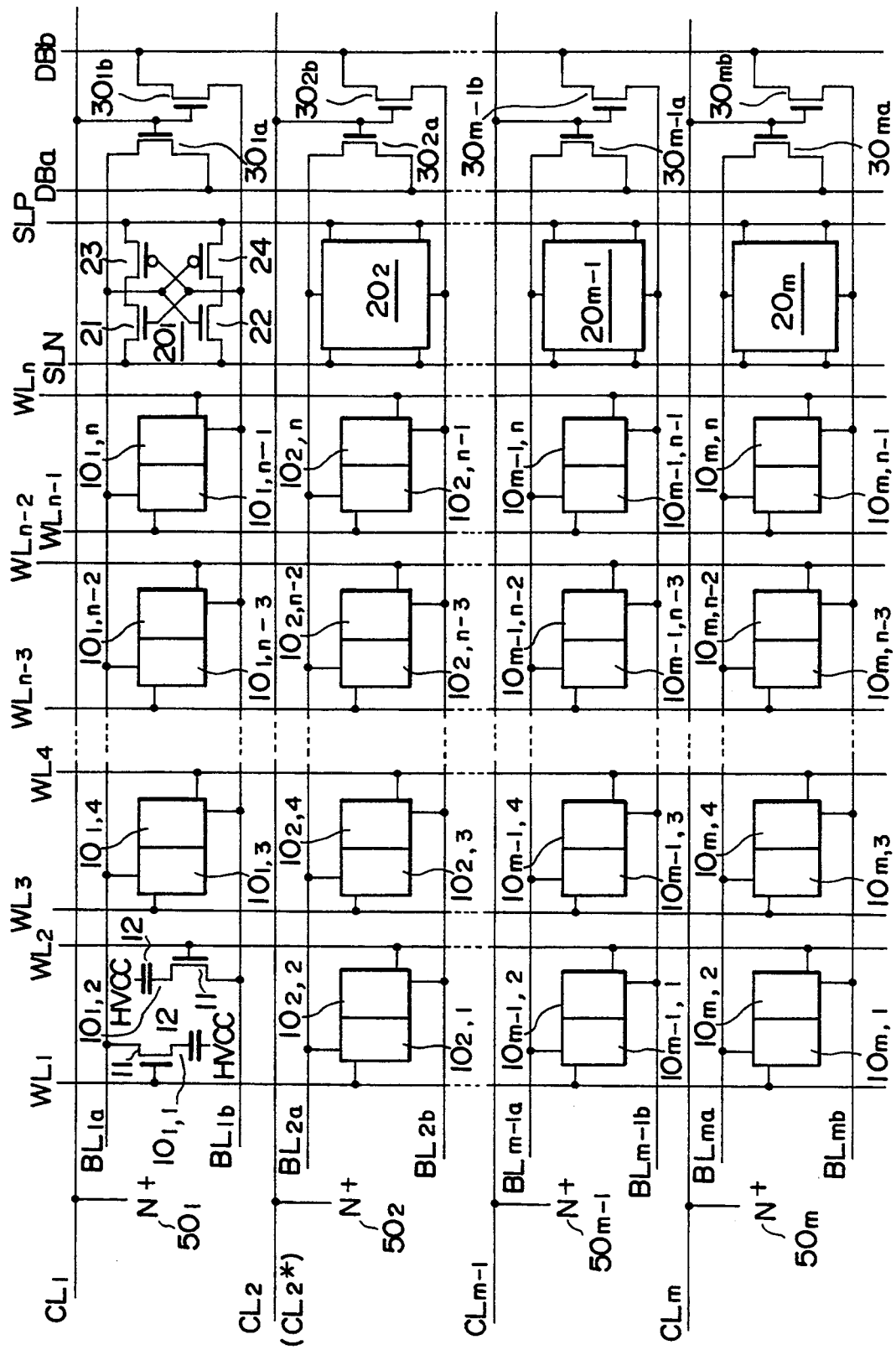
FIG. 4 is a diagram illustrating another embodiment of the semiconductor memory device according to the present invention.

Another embodiment of the present invention will be described below with reference to FIG. 4. The same elements of structure as those employed in the sub arrays of the semiconductor memory device shown in FIG. 1 are identified by the same reference numerals.

In the sub arrays, the column lines $CL_i$ are respectively connected via the nodes $N_{2-i}$ ($i=1, 2, \ldots, m$) to N type regions in reversely-biased PN junctions, e.g., N+ diffusion layers $50_i$ ($i=1, 2, \ldots, m$) formed in P-type substrates or P wells, which are used as an alternative to the clamping transistors NMOS $40_i$ shown in FIG. 1. The column lines $CL_i$ and the N+ diffusion layers $50_i$ are electrically connected to one another for each sub array.

Figure 5:
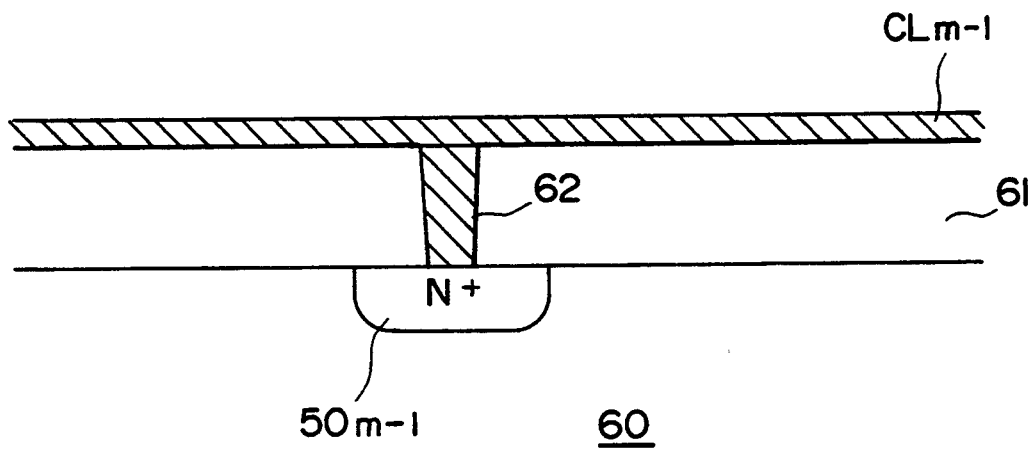
FIG. 5 is a partial cross-section of the diffusion layer N+ shown in FIG. 4.

FIG. 5 is a cross-sectional view showing the manner of connection of a column line $CL_{m-1}$ to an N+ diffusion layer $50_{m-1}$.

An N+ diffusion layer $50_{m-1}$ is formed within a negative-biased P-type substrate (or a P well). An insulative layer 61 is fabricated on the N+ diffusion layer $50_{m-1}$ and the column line $CL_{m-1}$ is formed on the insulative layer 61. The column line $CL_{m-1}$ and the N+ diffusion layer $50_{m-1}$ are electrically connected to each other via a through hole 62 of the insulative layer 61. A PN junction is formed of the P type substrate 60 and the N+ diffusion layer $50_{m-1}$.

Even when a column line $CL_2^*$ is brought to a floating state by disconnection with its potential or voltage level being maintained at an "H" level in the same manner as described above even in this case, electric charges held on the column line $CL_2^*$ are gradually discharged through the PN junction. Therefore, the non-selected column line $CL_2^*$ is not brought to a high potential. As a result, data which has been stored in a non-selected memory cell $10_{2,3}$, is not transferred to data buses $DB_a$, $DB_b$ by mistake. Only data which has been stored in a memory cell $10_{1,3}$, is accurately read so as to be supplied to the data buses $DB_a$, $DB_b$.

The P-type substrate 60 of the PN junction is brought to a negative bias potential. Therefore, when normally-operated column lines $CL_i$ are successively selected by the column address decoder and brought to "H" levels, the PN junction is biased in the reverse direction. Thus, the selected normally-operated column lines $CL_i$, which are "H" in level, are not immediately reduced to "L" levels through the PN junction.

In this case, the column lines $CL_i$ are electrically connected to the N+ diffusion layer $50_i$ respectively. Alternatively, the column lines $CL_i$ may be connected to other corresponding N-type regions of a reversely-biased PN junction.

According to the present invention, as has been described above, even if an arbitrary column line is broken, all the memory cells in a memory cell array can be reliably prevented from becoming inoperative.

The present invention has been described above specifically by the preferred embodiments. It will however be understood that the invention is not limited to the specific examples described. Many changes of the illustrated embodiments and other embodiments of the invention will be apparent to those skilled in the art from consideration of the specification and practice of the invention disclosed herein. It is thus intended that all the changes or the embodiments be considered as exemplarily only, with a true scope and spirit of the invention being covered by the following claims.

What is claimed is:

1. A memory comprising:
   a plurality of memory cell blocks each including
   (a) a plurality of memory cells each storing data therein,
   (b) a plurality of word lines for applying selection signals to said memory cells,
   (c) a data bus, and
   (d) a plurality of switching circuits respectively transferring data from said memory cells to said data bus in response to a first logic level signal applied thereto;
   a plurality of column lines each having first and second ends, said column lines each being connected to the corresponding switching circuit in each of said memory cell blocks;
   a column decoder, coupled to the first ends of said column lines, providing the first logic level signal to one of said column lines upon said memory blocks being accessed; and
   a plurality of potential setting circuits, coupled to the second ends of said column lines, preliminarily setting respective ones of said column lines to be in a predetermined potential so that each of said switching circuits is inactive prior to said column decoder providing the first logic level signal.

2. A memory comprising:
   a plurality of memory cells blocks each including
   (a) a plurality of memory cells each storing data therein,
   (b) a data bus,
   (c) a plurality of word lines for applying selection signals to said memory cells, and
   (d) a plurality of switching circuits respectively transferring data from said memory cells to said data bus in response to a first logic level signal applied thereto;
   a plurality of column lines each having first and second ends, said column lines each being connected to the corresponding switching circuit in each of said memory cell blocks;
   a column decoder, coupled to the first ends of said column lines, providing the first logic level signal to one of said column lines and a second logic level signal to the remaining ones of said column lines upon said memory cell blocks being accessed, the first logic level signal having a first potential, the second logic level signal having a second potential sufficiently less than the first potential so as to keep said switching circuits inactive; and
   a plurality of potential setting circuits, coupled to the second ends of said column lines, preliminarily setting said respective column lines to be in a predetermined potential less than the first potential so that each of said switching circuits is inactive prior to said column decoder providing the first logic level signal.

3. The memory according to claim 2, wherein said predetermined potential is substantially equal to the second potential.

4. A memory comprising:
   a memory cell array comprising n subarrays, wherein n is a natural number, a first said subarray located at a first side of the memory and an n-th one of said subarrays located at a second side of the memory opposite to the first side, each subarray including (a) a plurality of memory cells each storing data therein, (b) a plurality of word lines for applying selection signals to said memory cells, (c) a data bus, and (d) a plurality of switching circuit respectively transferring data from said memory cells to said data bus in response to a first logic level signal applied thereto;

a plurality of column lines coupled to corresponding switching circuits in each of said subarrays;

a column decoder, located at the first side adjacent to the first subarray, providing the first logic level signal to one of said column lines upon said subarray being accessed; and a plurality of clamping circuits, located at the second side adjacent to the n-th subarray and coupled to the column lines respectively, preliminarily setting said respective column lines to be in a predetermined potential so that said switching circuits each are inactive prior to said column decoder providing the first logic level signal.

5. The memory according to claim 4, wherein said plurality of clamping circuits further includes at least one clamping circuit positioned between the i-th subarray and the (i+1)-th subarray, wherein i is a natural number less than n.

6. The memory according to claim 4, wherein the memory is formed on a semiconductor substrate and said clamping circuit comprises the connection between the column line and a diffusion region formed in the semiconductor substrate.

7. A memory comprising:
a first and second nodes;
a memory cell storing data;
a word line for applying a selection signal to said memory cell;
a data bus;
a switching circuit for transferring data from said memory cell to said data bus in response to a first logic level signal applied thereto;
a column line coupled to the first and second nodes and said switching circuit;
a column decoder, coupled to the first node, providing the first logic level signal to the column line upon said memory cell being accessed, the first logic level signal having a first potential; and
a potential setting circuit, coupled to the second node, preliminarily setting said column line to be in a predetermined potential less than the first potential so that said switching circuits is inactive prior to said column decoder providing the first logic level signal.

8. A memory comprising:
first, second, third and fourth nodes;
first and second memory cells each storing data therein;
first and second word lines for applying selection signals to said first and second memory cells respectively;
a data bus;
a first switching circuit transferring data from said first memory cell to said data bus in response to a first logic level signal being applied thereto and being inactive in response to a second logic level signal being applied thereto;
a second switching circuit transferring data from said second memory cell to said data bus in response to the first logic level signal being applied thereto and being inactive in response to the second logic level signal being applied thereto;

a first column line coupled to the first and second nodes and said first switching circuit;

a second column line coupled to the third and fourth nodes and said second switching circuit;

a column decoder, coupled to the first and third nodes, providing the first logic level signal to one of the first and second column lines and the second logic level signal to the other column line, the first logic level signal having a first potential, the second logic level signal having a second potential sufficiently less than the first potential so as to keep said switching circuits inactive;

a first potential setting circuit, coupled to the second node, preliminarily setting the first column line to be in a predetermined potential less than the first potential so that said first switching circuit is inactive prior to said column decoder providing the first logic level signal; and a second potential setting circuit, coupled to the fourth node, preliminarily setting the second column line to be in the predetermined potential so that said second switching circuit is inactive prior to said column decoder providing the first logic level signal.

9. The memory according to claim 8, wherein said predetermined potential is substantially equal to the second potential.

10. The memory according to claim 1, wherein the memory is formed on a semiconductor substrate and said potential setting circuit comprises a connection between the column line and an impurity region formed in the semiconductor substrate.

11. The memory according to claim 2, wherein the memory is formed on a semiconductor substrate and said potential setting circuit comprises a connection between the column line and an impurity region formed in the semiconductor substrate.

12. The memory according to claim 7 wherein the memory is formed on a semiconductor substrate and said potential setting circuit comprises a connection between the column line and an impurity region formed in the semiconductor substrate.

13. The memory according to claim 8, wherein the memory is formed on a semiconductor substrate, and said first and second potential setting circuits comprise a connection between the column line and an impurity region formed in the semiconductor substrate.

14. The memory according to claim 1 wherein each of said potential setting circuits has a respective control terminal, and wherein all of said control terminals are connected to receive a common control signal so that all of said potential setting circuits are controlled to turn on and to turn off by said common control signal.

15. The memory according to claim 2 wherein each of said potential setting circuits has a respective control terminal, and wherein all of said control terminals are connected to receive a common control signal so that all of said potential setting circuits are controlled to turn on and to turn off by said common control signal.

16. The memory according to claim 4 wherein each of said clamping circuits has a respective control terminal, and wherein all of said control terminals are connected to receive a common control signal so that all of said clamping circuits are controlled to turn on and to turn off by said common control signal.

17. The memory according to claim 8 wherein each of said potential setting circuits has a respective control terminal, and wherein all of said control terminals are connected to receive a common control signal so that all of said potential setting circuits are controlled to turn on and to turn off by said common control signal.

* * * * *